(12) United States Patent
Rahman et al.

(10) Patent No.: US 8,802,454 B1
(45) Date of Patent: Aug. 12, 2014

(54) METHODS OF MANUFACTURING A SEMICONDUCTOR STRUCTURE

(75) Inventors: Arifur Rahman, San Jose, CA (US);
Henley Liu, San Jose, CA (US);
Cheang-Whang Chang, Mountain View, CA (US); Myongseob Kim, Pleasanton, CA (US); Dong W. Kim, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 234 days.

(21) Appl. No.: 13/331,702

(22) Filed: Dec. 20, 2011

(51) Int. Cl.
*H01L 21/66* (2006.01)

(52) U.S. Cl.
USPC ............... 438/17; 438/18; 438/759; 438/977

(58) Field of Classification Search
None
See application file for complete search history.

(56) References Cited

U.S. PATENT DOCUMENTS

| | | | |
|---|---|---|---|
| 3,783,353 | A | 1/1974 | Pankove |
| 4,056,773 | A | 11/1977 | Sullivan |
| 4,326,931 | A | 4/1982 | Kamijo et al. |
| 5,686,843 | A | 11/1997 | Beilstein et al. |
| 5,925,203 | A | 7/1999 | Riddle et al. |
| 6,034,851 | A | 3/2000 | Zarouri et al. |
| 6,256,207 | B1 | 7/2001 | Horiuchi et al. |
| 7,157,927 | B2 | 1/2007 | Okajima |
| 7,196,294 | B2 | 3/2007 | Hofmeister et al. |
| 7,218,820 | B2 | 5/2007 | Maida, Jr. |
| 7,541,203 | B1 | 6/2009 | Knickerbocker |
| 7,714,235 | B1 | 5/2010 | Pedersen et al. |
| 8,193,643 | B2 | 6/2012 | Tojo et al. |
| 8,436,639 | B2 * | 5/2013 | Goel .............................. 326/16 |
| 2012/0014017 | A1 * | 1/2012 | Ohnuki et al. ............. 360/294.1 |
| 2012/0242367 | A1 * | 9/2012 | Goel .............................. 326/16 |
| 2013/0093454 | A1 * | 4/2013 | Lai et al. .................. 324/762.01 |

FOREIGN PATENT DOCUMENTS

| | | | | |
|---|---|---|---|---|
| JP | 10098250 A | * | 4/1998 | ............. H05K 3/00 |
| JP | 10135368 A | * | 5/1998 | ............. H01L 23/12 |
| JP | 10-221372 A | | 8/1998 | |
| JP | 10246736 A | * | 9/1998 | ............ G01R 1/073 |
| JP | 10261855 A | * | 9/1998 | ............. H05K 1/11 |

OTHER PUBLICATIONS

U.S. Appl. No. 12/577,036, filed Oct. 9, 2009, Mardi et al.
3M, *3M Anisotropic Conductive Film (ACF) Adhesive 5363 Rework Process*, Mar. 2008, pp. 1-11, 3M Electronics Markets Materials Division, St. Paul, Minnesota, USA.

* cited by examiner

*Primary Examiner* — David E Graybill
(74) *Attorney, Agent, or Firm* — LeRoy D. Maunu; Lois D. Cartier

(57) ABSTRACT

A method for testing TSVs is provided. A plurality of TSVs is formed in a semiconductor substrate. Wiring layers and a first contact array are formed on the front-side of the substrate. The wiring layers couple each of the TSVs to a respective contact of the first contact array. Conductive adhesive is deposited over the first contact array. The conductive adhesive electrically couples contacts of the first contact array. A carrier is bonded to the front-side of the substrate with the conductive adhesive. After bonding the carrier to the substrate, the back-side of the substrate is thinned to expose each of the TSVs on the back-side of the substrate. A second contact array is formed, having a contact coupled to each respective TSV. Conductivity and connections of the TSVs, wiring layers, and contacts are tested by testing for conductivity between contacts of the second contact array.

20 Claims, 4 Drawing Sheets

METHODS OF MANUFACTURING A SEMICONDUCTOR STRUCTURE

FIELD OF THE INVENTION

One or more embodiments relate to the testing of integrated circuits (IC).

BACKGROUND

In many applications, it can be difficult to directly connect a die to another circuit or substrate, such as a printed circuit board (PCB). For example, if an integrated circuit is to be mounted on a PCB, wiring of the PCB may be too coarse to connect to the fine contacts of the integrated circuit. In such applications, the die and PCB may be interconnected through an interposer. An interposer is a silicon body having a first set of fine contacts (e.g., micro-bumps) on one side, to which a die may be bonded, and a second set of coarse contacts (e.g., C4 solder-bumps) on the other side for bonding to another chip, substrate, PCB, etc. Wiring and vias of the interposer may connect fine-pitched die contacts located on one side of the interposer to a coarser contact array on the opposite side of the interposer. An interposer may also provide interconnections between dice that are mounted on the same side of the interposer.

For clarity and ease of reference, a top surface of an interposer, semiconductor die, substrate, or any layer thereof may be referred to as a front-side and such terms are used interchangeably herein. Similarly, a bottom surface of an interposer, semiconductor die, substrate, or any layer thereof may be referred to as a back-side, and such terms are used interchangeably herein. The front-side of the substrate is the side having the fine contacts, and the back-side of the substrate is the side having the coarse contacts.

Through-silicon vias (TSVs) are used to connect the contacts on the front-side of the interposer to contacts on the back-side of the interposer. Metallized wiring layers may also be added to connect the TSVs to the contacts on the front-side of the interposer. However, in forming TSVs in a silicon body of an interposer, the silicon body is often thinned to less than 100 μm, which may present challenges for testing the interposer.

A frequent defect encountered in the manufacture of interposers is electrically open signal paths resulting from voids in TSVs or poor connection between the TSV and adjacent contacts (e.g., connection between solder-bump and TSV). The spacing between TSV is generally large enough that shorts between TSVs are unlikely.

One challenge in interposer manufacturing technologies is the testing of TSVs in the production environment. Previous methods for testing TSVs probe each TSV from the front-side and back-side simultaneously to check for continuity. Such methods are not practical and may result in damage for thinned interposer wafers having 25 um to 100 um thickness.

SUMMARY

In one embodiment, a method for testing a semiconductor structure is provided. A plurality of TSVs are formed in a semiconductor substrate. One or more wiring layers are formed on the front-side of the substrate. A first contact array is formed on the front-side of the substrate. The one or more wiring layers couple each of the TSVs to a respective contact of the first contact array. A layer of conductive adhesive is deposited over the first contact array on the front-side of the substrate. The conductive adhesive electrically couples contacts of the first contact array. A carrier is bonded to the front-side of the substrate with the conductive adhesive. After bonding the carrier to the substrate, the back-side of the substrate is thinned to expose each of the TSVs on the back-side of the substrate. A second contact array is formed on the thinned back side substrate. Each of the TSVs is coupled to a respective contact of the second contact array. Conductivity of the TSVs, wiring layers, and first and second contact arrays is tested by testing for conductivity between contacts of the second contact array.

In another embodiment, a method for manufacturing an interposer is provided. A plurality of TSVs are formed in an interposer substrate. One or more wiring layers are formed on the front-side of the interposer substrate. A micro-bump array is formed on the front-side of the interposer substrate. The one or more wiring layers couple each of the TSVs to a respective contact of the micro-bump array. A layer of conductive adhesive is deposited over the micro-bump array on the front-side of the interposer substrate. The conductive adhesive electrically couples contacts of the first contact array. A carrier is bonded to the front-side of the interposer substrate with the conductive adhesive. After bonding the carrier to the interposer substrate, the back-side of the interposer substrate is thinned to expose each of the TSVs on the back-side of the interposer substrate. A C4 solder-bump array is formed on the thinned back side substrate. Each of the TSVs is coupled to a respective contact of the C4 solder-bump array. Conductivity of the TSVs, wiring layers, micro-bump array, and C4 solder-bump array is tested by testing for conductivity between contacts of the C4 solder-bump array second contact array. After testing, the adhesive and carrier are separated from the interposer substrate.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which:

FIG. 2 shows a circuit model of the a pair of TSVs formed by the structure shown in FIG. 1-4; and FIG. 3 shows a flowchart of a method for formation and continuity testing of TSVs in accordance with one or more embodiments.

DETAILED DESCRIPTION

One or more embodiments provide a method for manufacturing and testing electrical connections and continuity of through silicon vias (TSVs) in an interposer. It is recognized that the contacts on the front-side and back-side of the interposer may be solder-bumps or contact pads, and the solder bumps may be micro-bumps, C4 solder-bumps, etc., depending on the particular implementation. For ease of explanation and illustration, embodiments and examples are primarily described herein with reference to an interposer having an array of micro-bumps on a front-side of the interposer and an array of C4 solder-bumps on a back-side of the interposer. For ease of reference, an array of micro-bumps, micro-bump pads, C4 solder-bumps, C4 pads, or other contacts, may generically be referred to as a contact array.

In one or more embodiments, a layer of conductive adhesive is formed over the contacts on the front-side of an interposer in order to electrically couple the contacts. A carrier is attached to the interposer using the conductive adhesive to provide support during thinning and subsequent testing of the interposer. After the back-side of the interposer is thinned to expose the TSV, and back-side contacts are formed, pairs of the back-side contacts are probed to test for continuity between the contacts. Because contacts on the front-side of the interposer are electrically connected by the conductive adhesive, a circuit may be tested for continuity from a first one of the back-side contacts to a second one of the back-side contacts. The tested circuit path is through a first TSV, through a first one of the front-side contacts, through the conductive adhesive, through a second one of the front-side contacts, and through a second TSV. Because only back-side contacts need to be probed for continuity tests, testing is mechanically simplified over previous approaches.

Figure 1:
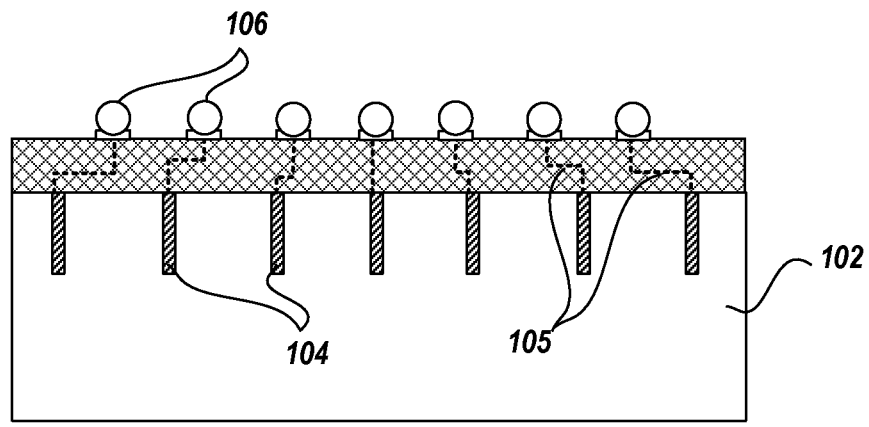
FIGS. 1-1 through 1-4 illustrate a process of forming and verifying through-silicon-vias (TSVs) in accordance with one or more embodiments.

FIGS. 1-1 through 1-4 illustrate a process of forming and verifying electrical connections and continuity of TSVs in accordance with one or more embodiments. FIG. 1-1 shows multiple TSVs 104 formed in a front-side of substrate 102. The TSVs may be formed using any of a number of known processes to form vias in a substrate and to fill the vias with conductive material. After forming the TSVs 104, one or more wiring layers 105 may be formed to route signals from the TSVs to various locations on the front-side of the interposer die. A plurality of micro-bump contacts 106 is formed on a front-side of the interposer at the various locations to form a micro-bump contact array. The one or more wiring layers 105 connect each of the TSVs 104 to a respective one of the micro-bumps 106 (connections shown as dashed lines).

Figures 1, 2:
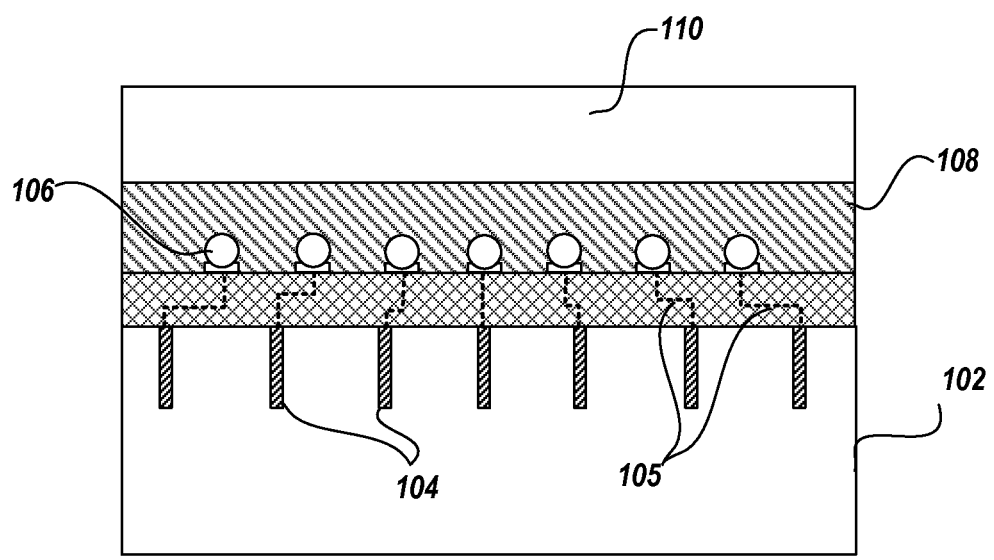

FIG. 1-2 shows a conductive adhesive 108 deposited over the micro-bumps. The conductive adhesive 108 electrically connects the contacts 106 for subsequent testing of the vias. In one or more embodiments, an insulating dielectric (not separately shown) may be formed over the wiring layers 105 prior to deposition of the conductive adhesive 108. This insulates the wiring from the conductive adhesive and ensures that electrical connections between the wiring 105 and the adhesive 108 can only be made through micro-bumps 106. This allows electrical connections between the micro-bumps 106 and TSVs 104 to be tested.

Before contacts may be formed on the back-side of the interposer, the substrate must be thinned to expose the TSVs on the back-side of the substrate. However, the thinned substrate is more susceptible to damage during testing than an un-thinned substrate. To reduce the risk of damaging the substrate, a carrier 110 is bonded to the front-side of the substrate 102 by the conductive adhesive 108. The carrier 110 provides support for the substrate 102 during the thinning and subsequent testing of electrical connection and continuity of the TSVs.

Figures 1, 2, 3:
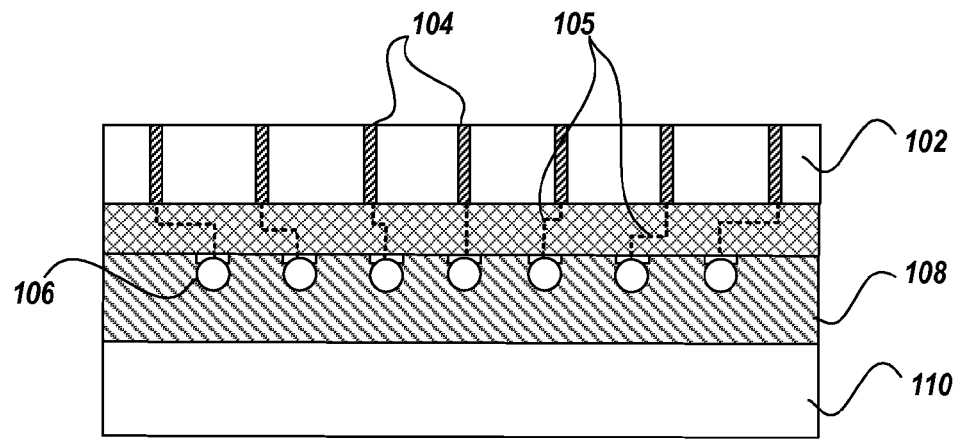
Figures 1, 2, 3, 4:
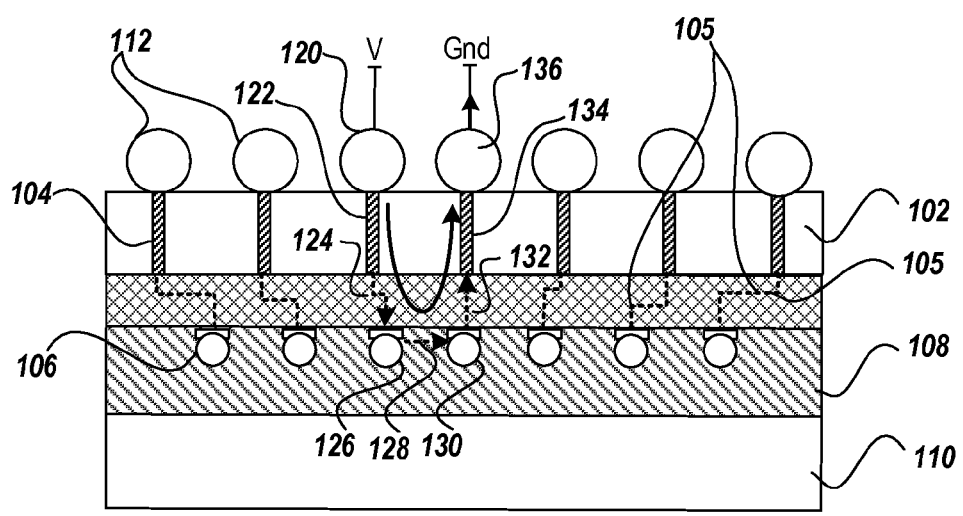
Figure 2:
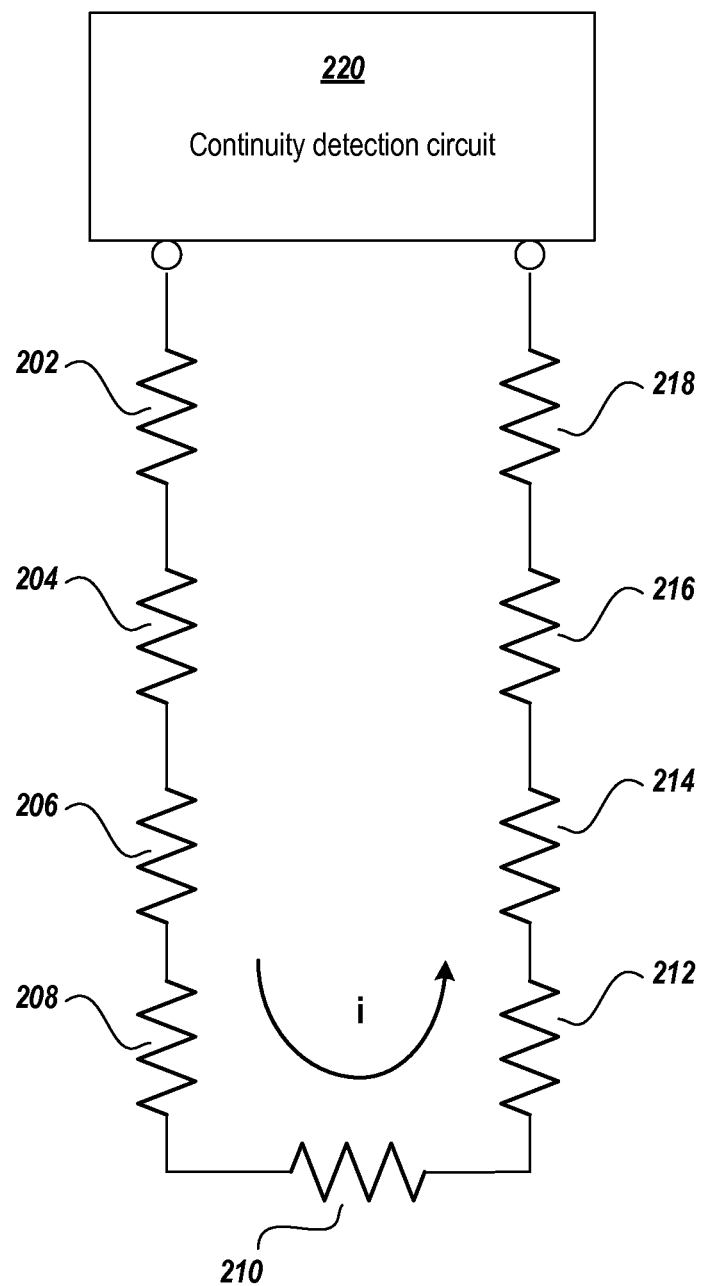
Figure 3:
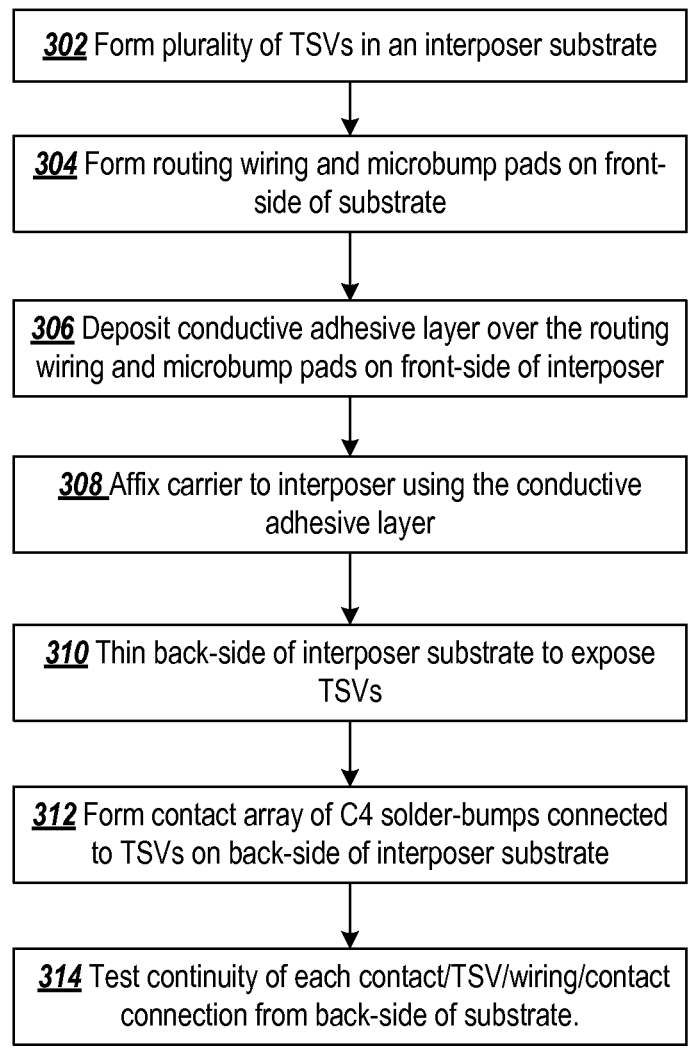

FIG. 1-3 illustrates the semiconductor shown in FIG. 1-2 (having been flipped front-side down) and the back-side of the substrate 102 having been thinned to expose the TSVs 104 on the back-side of the substrate. FIG. 1-4 shows a plurality of C4 solder-bumps 112 formed on the back-side of the interposer to form an array of C4 solder-bumps. Each of the TSVs 104 is electrically connected to a respective one of the C4 solder-bumps 112. For example, as described above, electrical connections and continuity of TSVs 122 and 134 may be tested by checking for continuity between back-side contacts 120 and 136. The continuity test checks for current flow from C4 solder-bump 120 to C4 solder-bump 136. The test checks for continuity through: TSV 122, routing wiring 124, front-side micro-bump 126, path 128 in conductive adhesive 108, front-side micro-bump 130, routing wiring 132, and TSV 134. Though the example shows testing between an adjacent pair of C4 solder bumps, it will be appreciated that the conductive adhesive allows testing between solder bumps regardless of position.

The carrier and conductive adhesive are removed once testing is completed to expose the micro-bump contacts. Removal may be performed for some adhesives, for example, by dissolving the electrically conductive adhesive with a suitable solvent. Some other electrically conductive adhesives may be removed by exposing the adhesive to UV radiation.

FIG. 2 shows a circuit model of a pair of TSVs formed by the structure shown in FIG. 1-4. Referring to the example discussed in connection with FIG. 1-4, resistors 204 and 216 represent a pair of through-silicon-vias 122 and 134 formed in the substrate 102. Resistors 202 and 218 represent C4 solder-bumps 120 and 136 on the back-side of the interposer. Resistors 206 and 214 represent circuit paths 124 and 132 through the one or more wiring layers 105, and resistors 208 and 212 represent micro-bumps 126 and 130 on the front-side of the interposer. Resistor 210 represents a path 128 through the electrically conductive adhesive 108 between micro-bumps 126 and 130.

In this example, C4 solder-bumps 120 and 136 are probed by continuity detection circuit 220, which determines if there is an expected amount of current through resistors 202-218. If current flow is detected, conductivity is verified for the pair of TSVs and electrical connections thereto. The continuity detection circuit 220 may be implemented using known circuits configured to check for continuity of a circuit path.

FIG. 3 shows a flowchart of a method for formation and continuity testing of TSVs in accordance with one or more embodiments. A plurality of TSVs is formed in an interposer substrate at block 302. Micro-bumps and one or more wiring layers are formed on the front-side of the substrate at block 304. The wiring layers connect the TSVs to respective ones of the micro-bumps. A layer of electrically conductive adhesive is deposited over the wiring layers and micro-bumps on the front-side of the interposer at block 306. Electrically conductive adhesives include a mixture of adhesive and conductive particles. Dow Corning DA 6524 and DA 6533 are possible adhesives that may be used to form the conductive adhesive layer. A carrier is affixed to the interposer using the electrically conductive adhesive layer at block 308. Some suitable carrier materials include: aluminum, tungsten, epoxy, quartz, glass, silicon, silicone and silicone-based rubbers, fiberglass-reinforced epoxy, pre-impregnated composite fibers, laminates, etc. Once the carrier has been attached, the substrate is thinned at block 310 to expose TSVs on the back-side of the substrate. A contact array of C4 solder-bumps is formed on the exposed TSVs at block 312. Each C4 solder-bump is connected to a respective one of the TSVs. Electrical connection and continuity of each C4 solder-bump/TSV/wiring/micro-bump structure are tested at block 314 by testing for continuity between pairs of C4 solder-bumps as described above. Continuity between the C4 solder-bumps may be checked pair wise sequentially or simultaneously. For example, a current source may be coupled to a first one of the C4 solder-bumps and one or more of the remaining C4 solder-bumps may be coupled to a respective detection circuits to determine if current flows from the first one of the C4 solder-bumps to each of the connected C4 solder bumps. The process may then be repeated using different subsets of the C4 solder bumps that have not been tested. The carrier and conductive adhesive are removed once testing is complete to expose the micro-bump contacts.

While the various embodiments are primarily described with reference to interposers, those skilled in the art will appreciate that the embodiments may be applicable to testing electrical connection and continuity of TSVs in a variety of other semiconductor applications as well.

What is claimed is:

1. A method of manufacturing a semiconductor structure, comprising:
   forming a plurality of through-silicon-vias (TSVs) in a semiconductor substrate;
   forming one or more wiring layers on a front-side of the substrate;
   forming a first contact array on the front-side of the substrate, the one or more wiring layers coupling each of the TSVs to a respective contact of the first contact array;
   depositing a layer of conductive adhesive over the first contact array on the front-side of the substrate, the conductive adhesive electrically coupling contacts of the first contact array;
   bonding a carrier to the front-side of the substrate with the conductive adhesive;
   after bonding the carrier to the substrate, thinning a back-side of the substrate to expose each of the TSVs on the back-side of the substrate;
   forming a second contact array on the thinned back-side of the substrate, each of the TSVs coupled to a respective contact of the second contact array; and
   testing for conductivity between contacts of the second contact array, whereby conductivity of the TSVs, wiring layers, and first and second contact arrays is tested.

2. The method of claim 1, wherein the depositing the layer of conductive adhesive includes providing the conductive adhesive with a floating voltage potential.

3. The method of claim 1, wherein the depositing the layer of conductive adhesive includes electrically connecting the conductive adhesive to the TSVs only through the first contact array.

4. The method of claim 1, wherein the testing for conductivity between contacts of the second contact array includes:
   selecting untested first and second contacts of the second contact array;
   testing for conductivity between the untested first and second contacts of the second contact array; and
   repeating the selecting and testing of untested first and second contacts until all the contacts of the second contact array have been tested.

5. The method of claim 1, wherein the forming of the plurality of TSVs in the semiconductor substrate includes forming the TSVs in the semiconductor substrate that does not include any active circuitry.

6. The method of claim 1, wherein the testing for conductivity between contacts of the second contact array includes:
   aligning the second contact array with a third contact array of an automated testing circuit configured to check for continuity between pairs of contacts of the third contact array.

7. The method of claim 1, wherein the one or more wiring layers includes a plurality of vias.

8. The method of claim 1, further comprising separating the carrier and adhesive from the first contact array, wiring layers and substrate.

9. The method of claim 1, wherein the first contact array comprises an array of micro-bumps.

10. The method of claim 1, wherein the second contact array comprises an array of C4 bumps.

11. The method of claim 1, wherein the carrier comprises a film having the conductive adhesive on one side.

12. A method of manufacturing an interposer, comprising:
   forming a plurality of through-silicon-vias (TSVs) in an interposer substrate;
   forming one or more wiring layers on a front-side of the interposer substrate;
   forming a micro-bump array on the one or more wiring layers, the one or more wiring layers coupling each of the TSVs to a respective micro-bump of the micro-bump array;
   depositing a layer of conductive adhesive over the micro-bump array and wiring layers, the conductive adhesive electrically coupling contacts of the micro-bump array one to another;
   bonding a carrier to the micro-bump array and wiring layers with the conductive adhesive;
   after bonding the carrier to the substrate, thinning a back-side of the substrate to expose each of the TSVs on the back-side of the substrate;
   forming a C4 solder-bump array on the thinned back-side of the substrate, each of the TSVs coupled to a respective contact of the C4 solder-bump array;
   testing for conductivity between contacts of the C4 solder-bump array, whereby conductivity of the TSVs, wiring layers, micro-bump array and C4 solder-bump array is tested; and
   separating the carrier and conductive adhesive from the substrate after the testing.

13. The method of claim 12, wherein the layer of conductive adhesive has a floating voltage potential during the testing.

14. The method of claim 12, wherein the depositing the layer of conductive adhesive includes electrically connecting the conductive adhesive to the TSVs only through the C4 solder-bump array.

15. The method of claim 12, wherein the testing for conductivity between contacts of the C4 solder-bump array includes:
   selecting untested first and second contacts of the of the C4 solder-bump array;
   testing for conductivity between the untested first and second contacts; and
   repeating the selecting and testing of untested first and second contacts until all the contacts of the C4 solder-bump array have been tested.

16. The method of claim 12, wherein the forming of the plurality of TSVs in the semiconductor substrate includes forming the TSVs in the semiconductor substrate that does not include any active circuitry.

17. The method of claim 12, wherein the testing for conductivity between contacts of the second contact array includes:
   aligning the second contact array with a third contact array of an automated testing circuit configured to check for continuity between pairs of contacts of the C4 solder-bump array.

18. The method of claim 12, wherein the one or more wiring layers includes a plurality of vias.

19. The method of claim 12, wherein separating the carrier and conductive adhesive from the first contact array includes dissolving the conductive adhesive with a solvent.

20. The method of claim 12, wherein separating the carrier and conductive adhesive from the first contact array includes exposing the conductive adhesive to UV radiation.

* * * * *